(12) United States Patent
Ishigami et al.

(10) Patent No.: US 7,512,165 B2
(45) Date of Patent: Mar. 31, 2009

(54) PHOTOELECTRIC CONVERSION MODULE AND OPTICAL TRANSCEIVER USING THE SAME

(75) Inventors: Yoshiaki Ishigami, Hitachi (JP); Yoshinori Sunaga, Hitachinaka (JP)

(73) Assignee: Hitachi Cable, Ltd., Chiyoda-ku, Tokyo (JP)

(*) Notice: Subject to any disclaimer, the term of this patent is extended or adjusted under 35 U.S.C. 154(b) by 231 days.

(21) Appl. No.: 10/984,998

(22) Filed: Nov. 10, 2004

(65) Prior Publication Data

US 2005/0111503 A1    May 26, 2005

(30) Foreign Application Priority Data

Nov. 13, 2003  (JP)  ............................ 2003-383657
Jul. 9, 2004    (JP)  ............................ 2004-203028

(51) Int. Cl.
*H01S 3/00*  (2006.01)
*H01S 3/04*  (2006.01)
(52) U.S. Cl. ...................................... 372/38.1; 372/36
(58) Field of Classification Search ................ 372/38.1, 372/36; 398/135, 202, 182, 140
See application file for complete search history.

(56) References Cited

U.S. PATENT DOCUMENTS

| | | | | |
|---|---|---|---|---|
| 3,829,793 A | * | 8/1974 | Jensen et al. | .................. 372/89 |
| 5,291,201 A | * | 3/1994 | Endler et al. | .................. 342/14 |
| 5,574,805 A | * | 11/1996 | Toba et al. | ...................... 385/3 |
| 6,301,278 B2 | * | 10/2001 | Uchida | .......................... 372/36 |
| 2004/0208211 A1 | * | 10/2004 | Maruyama et al. | ......... 372/38.1 |

FOREIGN PATENT DOCUMENTS

| | | |
|---|---|---|
| JP | 5-327617 | 12/1993 |
| JP | 6-342866 | 12/1994 |
| JP | 2003-158333 | 5/2003 |

* cited by examiner

*Primary Examiner*—Minsun Harvey
*Assistant Examiner*—Patrick Stafford
(74) *Attorney, Agent, or Firm*—McGinn IP Law Group, PLLC

(57) ABSTRACT

A photoelectric conversion module has an optical element to transmit/receive optical signals, a stem to fix the optical element, a cap to cover the optical element, and a plurality of leads to impose electric signals to the optical element or to transmit electric signals from the optical element, wherein a flat section is disposed at an end of a predetermined lead located inside the package formed of a stem and the cap, and on the flat section, there is provided an electric circuit component one end of which is connected to the optical element and the other end of which is connected to the lead.

27 Claims, 10 Drawing Sheets

A flat section disposed at an end of a predetermined lead of the plurality of the leads positioned in a package formed of the stem and the cap, and

PHOTOELECTRIC CONVERSION MODULE AND OPTICAL TRANSCEIVER USING THE SAME

The present application is based on Japanese patent application Nos. 2003-383657 and 2004-203028, the entire contents of which are incorporated herein by reference.

BACKGROUND OF THE INVENTION

1. Field of the Invention

The present invention relates to a photoelectric conversion module which includes an optical element and a lead to pass through a package, and an optical transceiver using the same.

2. The Related Art of the Invention

FIG. 1 shows a conventional photoelectric conversion module 81. The conventional photoelectric conversion module 81 mounts a semiconductor laser (LD) element 82 on a heat sink (column) 84 inside a package 83 through a sub-mount 85.

The package 83 includes a disc-shaped stem 83s, and a cylindrical cap 83c to cover an upper surface of the stem 83s and the LD element 82. In general the package 83 is called "Can package" and used most widely as an inexpensive package of a photoelectric conversion module (LD module) for a container of the LD element 82.

The heat sink 84 is fixed on the stem 83s, and a plurality of substantially columnar leads 86 passing through the package 83 and made of metal of Fe group, are installed in the stem 83s. A lens 87 is mounted on an upper part of the cap 83c to collect a laser beam L from the LD element 82.

A cathode of the LD element 82 is electrically connected to the lead 86 by wire-bonding a gilded cathode electrode 88 formed on the surface of the LD element 82 to the lead 86 with a wire 89.

Further, an anode as a backside of the LD element 82 is soldered to the sub-mount 85 through a gilded anode electrode 90 formed on the sub-mount 85. The sub-mount 85 to which the LD element 82 is soldered, is fixed to the heat sink 84 with solder.

In case the stem 83s is an anode-type, which is not illustrated in detail, the anode of the LD element 82 is electrically connected to the heat sink 84 by a via hole to penetrate the anode electrode 90 and the sub-mount 85, or by wire-bonding the anode electrode 90 to the heat sink 84 with a wire. In the case of a floating-type, the anode of the LD element 82 is electrically connected to a different lead 86 by wire-bonding the anode electrode 90 to the different lead 86 with a wire.

The LD element 82 is so small that it is not easy to treat and locate it, and thus, as stated above, the LD element is mounted on the sub-mount 85 in advance in order to make the treatment easier, and then the sub-mount 85 gets installed on the heat sink 84.

The photoelectric conversion module 81 is used as built in an electronic device. The electronic device includes an LD driver for driving the LD element 82, and a substrate on which a semiconductor element such as the LD driver is installed.

Besides, since an optical communication is performed at a high transmission speed exceeding Gbps in recent years, an electronic device used for the optical communication, for instance an optical transceiver, may include a coaxial cable to transmit a high-frequency signal from the LD driver to the LD element 82.

It is noted that Japanese Unexamined Patent Publication No. 5-327617 exists as a technical document relating to the present invention.

However, in such photoelectric conversion module 81 it is not designed to make impedance matching between the LD element 82 in the package 83 and the components outside the package 83, such as the LD driver, the substrate, the coaxial cable, and the like.

In general the impedance of the LD element 82 (for instance, approximately 7 Ω) is different from that of the LD driver or the substrate (for instance, 25 Ω). As a result, in the module 81, when the LD element 82 emits light particularly at a high-frequency signal, the high-frequency signal causes reflection between the LD element 82 and the LD driver, or between the LD element 82 and the substrate, and thus the LD element 82 or the LD driver doesn't work accurately. Consequently the high-frequency characteristic is deteriorated.

The reflection of the high-frequency signal is also produced between the LD element 82 and the coaxial cable (for instance, impedance 50 Ω), and therefore, there occurs also a problem that the high-frequency characteristic of the photoelectric conversion module 81 is deteriorated.

In order for the impedance of the LD element 82 to match that of those components outside the package-83, there are the following two methods to be considered.

A first method achieves the impedance matching by disposing a terminal resistor to be connected with the LD element 82 outside the package 83. However, since in the first method, the distance between the LD element 82 and the terminal resistor tends to be long, there is a case where reflection of the high-frequency signal between the LD element 82 and the terminal resistor can be produced. That still causes a problem of deteriorating the high-frequency characteristic of the module 81. That is, unless the terminal resistor is set adjacent to the LD element 82, the impedance-matching is not performed efficiently.

A second method achieves the impedance matching by receiving a terminal resistor to be connected with the LD element 82 inside the package 83. However, since in the second method, the package 83 is so small, it is difficult to receive a new terminal resistor inside the package 83 from the spatial point of view. Accordingly if the new terminal resistor is installed inside the package 83, the photoelectric conversion module 81 will become bigger in size. In addition, in this case heat generated by the terminal resistor can be another problem.

SUMMARY OF THE INVENTION

It is an object of the present invention to provide a compact photoelectric conversion module that has an excellent high-frequency characteristic, and an optical transceiver using the same.

According to one aspect of the present invention, a photoelectric conversion module comprises, an optical element to transmit/receive an optical signal, a stem to fix the optical element, a cap to cover the optical element, a plurality of leads to impress an electrical signal on the optical element or to transmit an electric signal from the optical element, the photoelectric conversion module a flat section disposed at an end of a predetermined lead of the plurality of the leads positioned in a package formed of the stem and the cap, and an electric circuit component disposed in the flat section, wherein:

one end of the electric circuit component is connected to the optical element and the other end thereof is connected to the predetermined lead.

The electric circuit component may preferably comprise a terminal resistor to impedance-match the optical element to a component outside the package.

The terminal resistor may preferably comprise a thin-film resistor as a plate-like resistor with electrodes formed at both ends of the resistor, wherein:

the resistor is located to direct a thickness direction thereof to be perpendicular to a mounting-face of the optical element.

The thin-film resistor may preferably comprise a through-via hole, which is formed therein to pass through one of the electrodes in a thickness direction thereof, and to electrically connect the one of the electrodes with the flat section.

The terminal resistor may preferably comprise a thick-film resistor with electrodes formed at both ends of a resistor body in a cuboid shape, wherein the resistor is located to direct a thickness direction thereof to be perpendicular to a mounting-face of the optical element.

The electric circuit component may preferably comprise a substrate on a surface of which an integrated circuit pattern including at least one of a resistor, an inductor, and a capacitor is formed.

The substrate may preferably comprise a through-via hole, which is formed therein to pass through the circuit pattern in a thickness direction of the substrate, and to electrically connect the circuit pattern with the flat section.

The predetermined lead may preferably be made of copper alloy, wherein:

a diameter of the predetermined lead is larger than that of another lead which is not connected to the optical element.

An insulator may be disposed in a through hole to pass through the package, wherein:

the predetermined lead is inserted into the insulator.

According to a further aspect of the present invention, an optical transceiver comprises a photoelectric conversion module comprising:

an optical element to transmit/receive an optical signal, a stem to fix the optical element, a cap to cover the optical element, a plurality of leads to impress an electrical signal on the optical element or to transmit an electric signal from the optical element, the photoelectric conversion module, a flat section disposed at an end of a predetermined lead of the plurality of the leads positioned in a package formed of the stem and the cap, and an electric circuit component disposed in the flat section, wherein:

one end of the electric circuit component is connected to the optical element and the other end thereof is connected to the predetermined lead.

The electric circuit component in the optical transceiver may preferably comprise a terminal resistor to impedance-match the optical element to a component outside the package.

The terminal resistor in the optical transceiver may preferably comprise a thin-film resistor as a plate-like resistor with electrodes formed at both ends of the resistor, wherein:

the resistor is located to direct a thickness direction thereof to be perpendicular to a mounting-face of the optical element.

The thin-film resistor in the optical transceiver may preferably comprise a through-via hole, which is formed therein to pass through one of the electrodes in a thickness direction thereof, and to electrically connect the one of the electrodes with the flat section.

The terminal resistor in the optical transceiver may preferably comprise a thick-film resistor with electrodes formed at both ends of a resistor body in a cuboid shape, wherein the resistor is located to direct a thickness direction thereof to be perpendicular to a mounting-face of the optical element.

The electric circuit component in the optical transceiver may preferably comprise a substrate on a surface of which an integrated circuit pattern comprising at least one of a resistor, an inductor, and a capacitor is formed.

The substrate in the optical transceiver may preferably comprise a through-via hole, which is formed therein to pass through the circuit pattern in a thickness direction of the substrate, and to electrically connect the circuit pattern with the flat section.

The predetermined lead in the optical transceiver may preferably be made of copper alloy, wherein:

a diameter of the predetermined lead is larger than that of another lead which is not connected to the optical element.

An insulator in the optical transceiver may preferably be disposed in a through hole to pass through the package, wherein:

the predetermined lead is inserted into the insulator.

ADVANTAGES OF THE INVENTION

From what is stated above, it's obvious that the following excellent advantages can be achieved according to the present invention.

(1) Excellent high-frequency response
(2) Downsizing
(3) High efficiency in heat release property These and other objects, features, aspects and advantages of the present invention will become apparent to those skilled in the art from the following detailed description, which, taken in conjunction with the annexed drawings, discloses a preferred embodiments of the present invention.

BRIEF DESCRIPTION OF THE DRAWINGS

The preferred embodiments according to the invention will be explained below referring to the drawings, wherein.

DETAILED DESCRIPTION OF THE PREFERRED EMBODIMENT

First Preferred Embodiment

Figure 1:
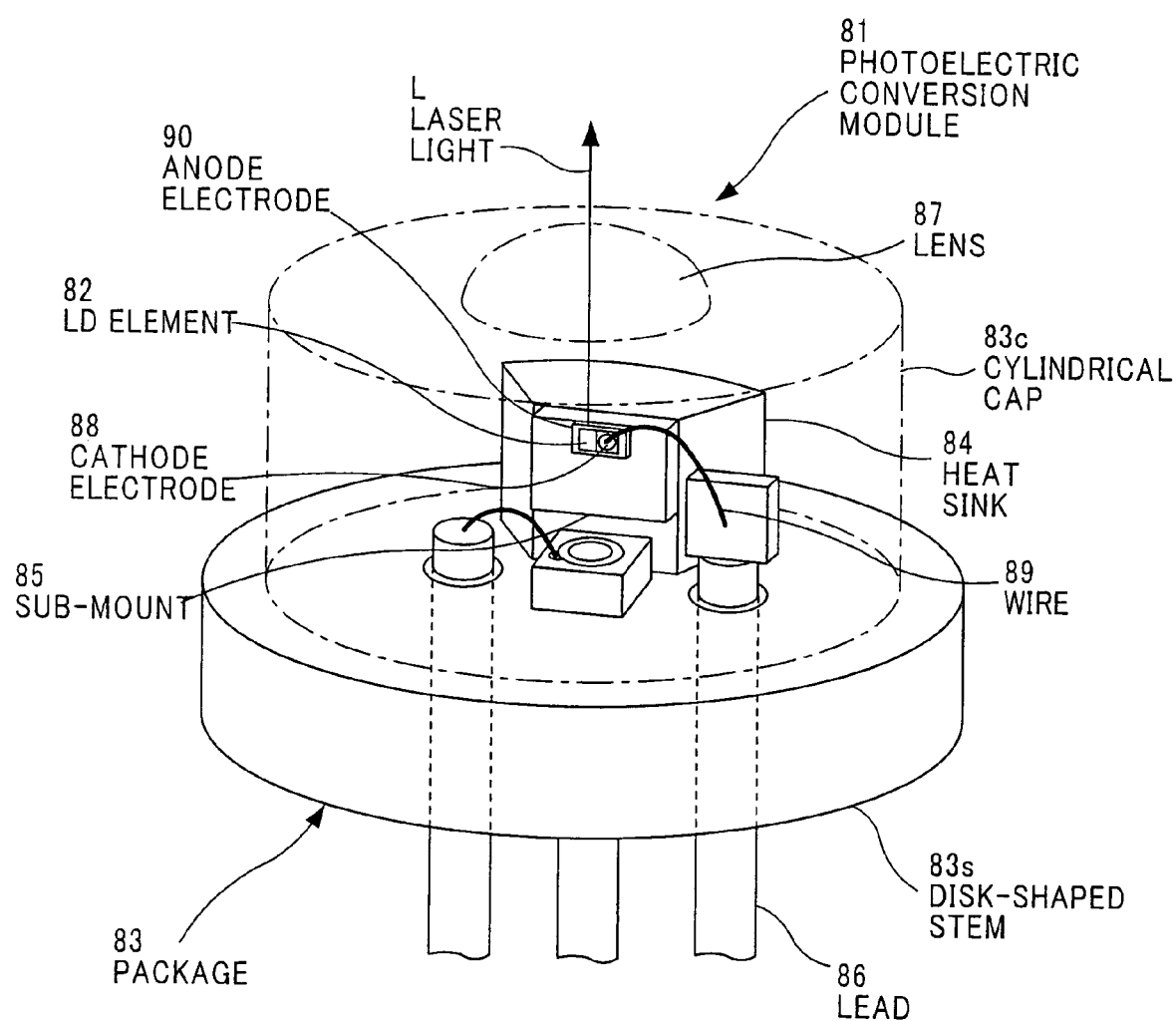
FIG. 1 is a perspective view showing a photoelectric conversion module of the related art.
Figure 2A:
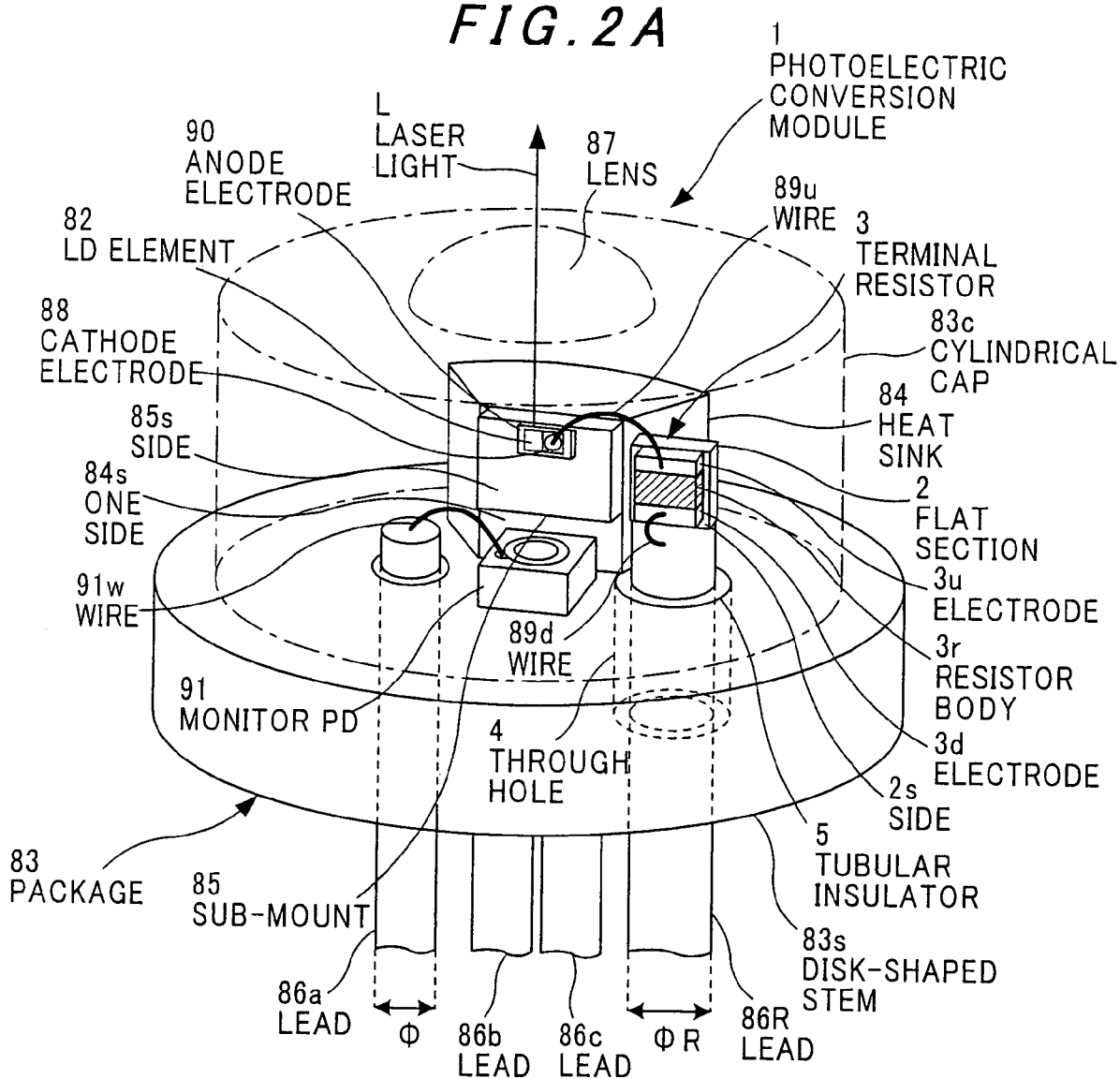
FIG. 2A is a perspective view showing a photoelectric conversion module to be driven by a single circuit in a first preferred embodiment according to the present invention.
Figure 2B:
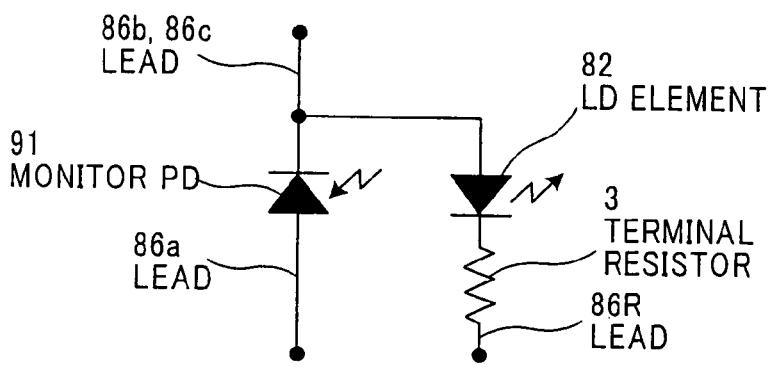
FIG. 2B is a perspective view of a circuit diagram of the photoelectric conversion module.
Figure 7:
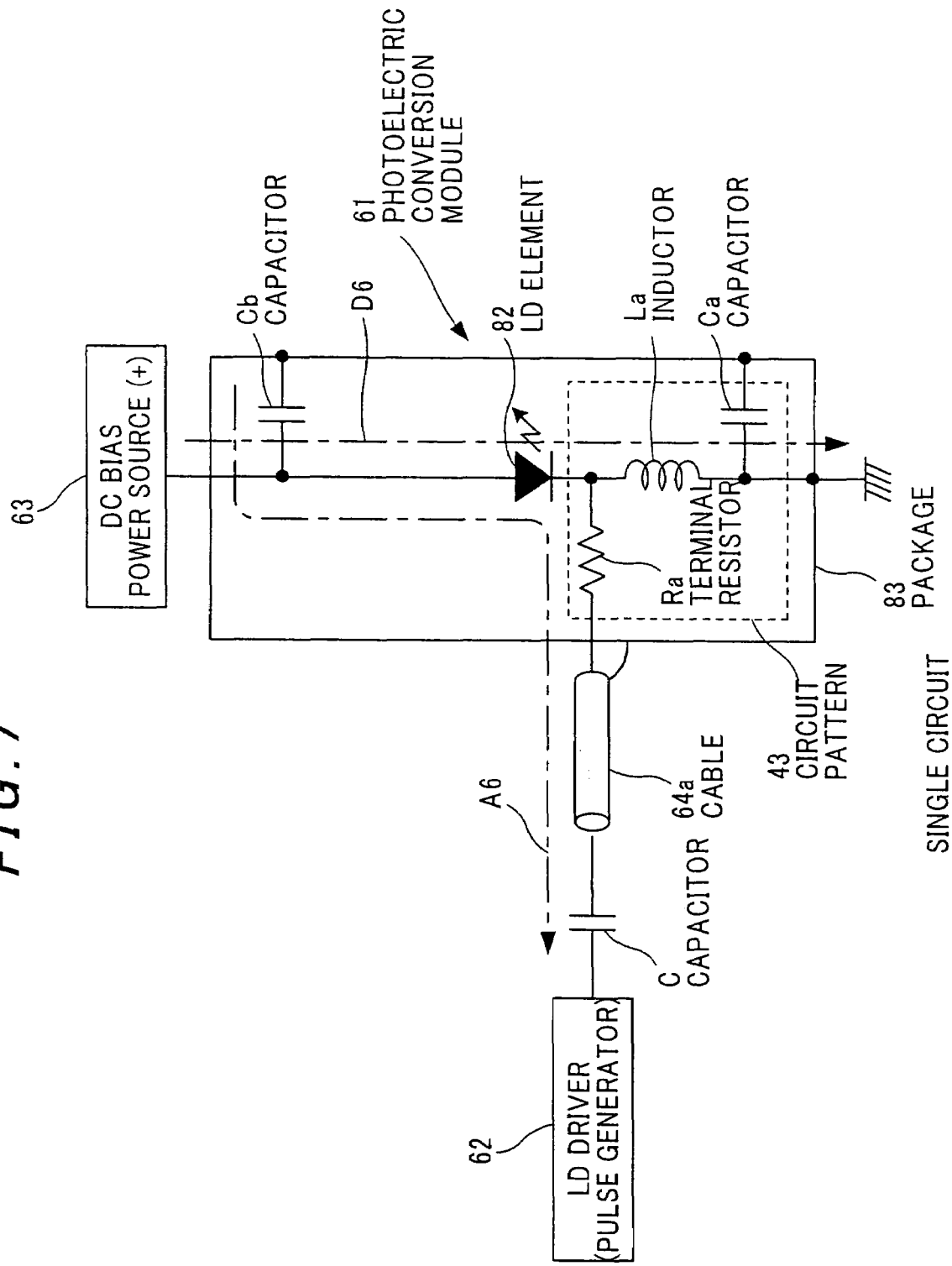
FIG. 7 is a circuit diagram showing a first example of a peripheral circuit of the photoelectric conversion module in the first preferred embodiment according to the present invention.

FIG. 2A is a perspective view showing a photoelectric conversion module in a first preferred embodiment according to the present invention, and FIG. 2B is its circuit diagram. FIG. 2A is an implementation example of driving an LD element with a single circuit to be mentioned later in FIG. 7, and FIG. 2B shows its wiring example.

FIG. 2A shows the photoelectric conversion module 1 in the first preferred embodiment. The photoelectric conversion module 1 mounts an end-face light emitting-type of a semiconductor laser diode (LD) element 82 as an optical element to transmit an optical signal L, on a side 84s of a heat sink (column) 84 inside a package 83 through a plate-like sub-mount 85 made of ceramic.

The heat sink 84 is formed of metal with a high efficiency of heat radiation, for instance, Cu, CuW, Al, Fe, or the like. The package 83 is formed of metal with a high efficiency of heat radiation, as well and is a "Can package" formed of a disc shaped stem 83s to fix the LD element 82 and a cylindrical cap 83c to cover an upper surface of the stem 83s and the LD element 82.

The photoelectric conversion module 1 receiving the LD element 82 converts an inputted electric signal into an optical signal and then outputs the optical signal as a laser beam L of the LD element 82, and therefore it's also called an optical element module or an LD element module.

The heat sink 84 is fixed on the stem 83s and four substantially columnar leads 86a to 86c, and 86R are mounted to the stem 83s as a plurality of the leads passing through the stem 83s vertically, namely passing through the package 83. Each lead 86a to 86c, and 86R is formed of Fe-group metal.

And in the lead 86a a tubular insulator such as glass is disposed to a through hole passing through the stem 83s vertically and the lead 86a is nonconductive to, and insulated from, the stem 83s due to being inserted into the insulator, which also keeps an inside of the package 83 airtight. The leads 86b and 86c are directly connected to the stem 83s, and accordingly are electrically connected to the stem 83s. A lens 87 which collects a laser beam L from the LD element 82 is mounted on an upper portion of the cap 83.

An anode as the backside of the LD element 83 is soldered to a side of the sub-mount 85 through a gilded anode electrode 90 formed on the sub-mount 85. The sub-mount 85 to which the LD element 82 is soldered, is soldered to the heat sink 84.

When the stem 83s is an anode-type (refer to FIG. 2A), which is not illustrated in detail, the anode of the LD element 82 is electrically connected to the heat sink 84 by a via hole penetrating the anode electrode 90 and the sub-mount 85, or by wire-bonding the anode electrode 90 to the heat sink 84 with a wire. In the case of a floating-type (refer to FIGS. 13A and 13B), the anode of the LD element 82 is electrically connected to a different lead (a lead 86L to be described later in FIGS. 13A and 13B) by wire-bonding the anode electrode 90 to the different lead with a wire.

In the first preferred embodiment, since the end-face light emitting-type of the LD element 82 is used, the LD element 82 is mounted on the heat sink 84 through the sub-mount 85 so that an optical axis of the laser beam L emitted toward the lens 87 from an end face of the LD element 82 corresponds to a central axis of each of the stem 83s and the cap 83c, and also a central axis of the lens 87.

Besides, one side 84s of the heat sink 84 to mount the sub-mount 85, and both front and back sides of the sub-mount 85 (a side 85s and its opposite side) are leveled to be in parallel with an optical axis of the laser beam L of the LD element 82 (vertical to an end side with a light emitting portion of the LD element 82).

In the photoelectric conversion module 1, a substantially plate-shaped flat section 2 leveled so as to be in parallel with the optical axis of the laser beam L from the LD element 82 (vertical to the end side with the light emitting portion of the LD element 82) is disposed at one end of the lead 86R in the vicinity of the LD element 82 located inside the package 83, and a terminal resistor 3 which impedance-matches the LD element 82 to those components such as an LD driver, a substrate, a coaxial cable, or the like outside the package 83, is mounted on one side 2s of the flat section 2 as an electric circuit component one end of which is connected to the LD element 82 and the other side of which is connected to the lead 86R. The lead 86R is formed of metal such as Cu or Cu alloy, or Fe-group such as Fe.

The flat section 2, in order to facilitate wire-bonding to be mentioned later, is formed at the one end (in FIG. 3A, an upper end) of the lead 86R so as to be in parallel with the one side 84s of the heat sink 84 and both the front and back sides of the sub-mount 85. Faces to which wires 89u and 89d to be mentioned later are mounted are required to be in parallel with each other because otherwise the wire-bonding would be impossible. The flat section 2 may be formed by being mounted to the one end of the lead 86R, pressing the one end of the lead 86R, or flattening it.

The terminal resistor 3 is a thin-film resistor (a thin-film chip resistor) formed by forming electrodes 3u and 3d of metal such as Au or Cu, at both ends of a plate shaped resistor body 3r forming a thin-film resistor body on a surface of a ceramic material.

The terminal resistor 3 is located so that the thickness direction is perpendicular to the side 85s of the sub-mount 85 as a mounting face of the LD element 82. In the first preferred embodiment, since the end-face light emitting-type of the LD element 82 is used, the terminal resistor 3 is fixed on the side 2s of the flat section 2 of the lead 86R with, for instance, conductive adhesives or solder so that the electrodes 3u and 3d at the both ends are disposed respectively in an upside and a downside.

A cathode of the LD element 82, by wire-bonding a cathode electrode 88 formed on the surface of the LD element 82 to the electrode 3u of the terminal resistor 3 with the wire 89u, and wire-bonding the electrode 3d of the terminal resistor 3 to the lead 86R with the wire 89d, is electrically connected to the lead 86R through the terminal resistor 3.

A lead diameter φR of the lead 86R is formed to be larger by more than the tolerance or the variations in the manufacture than a diameter φ of each of the other leads 86a to 86c which are not electrically connected to the LD element 82. For example, when the diameter of the other lead is set as φ0.45±0.04 (mm), φR>0.49 (mm) may be set.

This is because that, by increasing the dimension of φR, the heat generated at the terminal resistor 3 is less likely to be transmitted to the LD element 82, while more likely to be transmitted to the stem 83s, the cap 83c, or the lead 86R protruding downward from the stem 83s, and thus the heat can be more efficiently released outside the package 83.

However, in the embodiment for the description above, since effectiveness of the heat release can be achieved even in the case of φR≦0.49 mm, the diameter φR of the lead 86R is not always required to be φR>0.49 mm.

The lead 86R passes through the stem 83s in the upside and downside directions. Namely the tubular insulator 5 is disposed in a column-shaped through hole 4 passing through the package 83 vertically, which has substantially the same length as the thickness of the stem 83s, and the lead 86R is inserted into the insulator 5. As a material for the insulator 5, which also serves as a nonconductor to electrically insulate the lead 86R from the stem 83s, for instance, low-melting glass, epoxy resin, foamed glass, porous ceramics, or the like, is used.

After each component has been mounted or attached to the stem 83s, the stem 83s and the cap 83c are air-tightly sealed by resistance welding so that an inert gas at room temperature (for instance, $N_2$) is filled up inside the package 83.

In more detail, the LD element 82 is located substantially at the center of the package 83, and the cathode electrode 88 of the LD element 82 is located offset from the center of the package 83 to the right side in FIG. 2A.

Accordingly, in order to provide a shortest electrical connection between the cathode electrode 88 of the LD element 82 and the lead 86R, the flat section 2 is formed at an end of the lead 86R at the right end in FIG. 2A, and then the terminal resistor 3 is mounted on the flat section 2, and furthermore, the cathode electrode 88 is electrically connected to the electrode 3u of the terminal resistor 3 with the wire 89u by wire-bonding, and the electrode 3d of the terminal resistor 3 is also electrically connected to the lead 86R with the wire 89d by wire-bonding.

Besides, a monitor PD (photo diode) 91 to monitor an optical output from the LD element 82 is mounted on the stem 83s, directly under and adjacent to the LD element 82. In FIG. 2A, an anode of the monitor PD 91, by being wire-bonded to an end of the left end lead 86a with a wire 91w, can be electrically connected thereto at shortest. A backside of the monitor PD 91 is a cathode.

Namely the lead 86a is used as the anode of the monitor PD 91, the lead 86b and 86c are respectively used as the cathode of the monitor PD 91 and the anode of the LD element 82, and the lead 86R is used as the cathode of the LD element 82.

Second Preferred Embodiment

The photoelectric conversion module 1 including those components described above is used by being incorporated into an electronic device such as an optical transceiver equipped with an LD driver, a circuit substrate, a coaxial cable or the like as components mounted outside the package 83.

Next, as a second preferred embodiment according to the present invention, an optical transceiver using the photoelectric conversion module 1 will be described.

Figure 12:
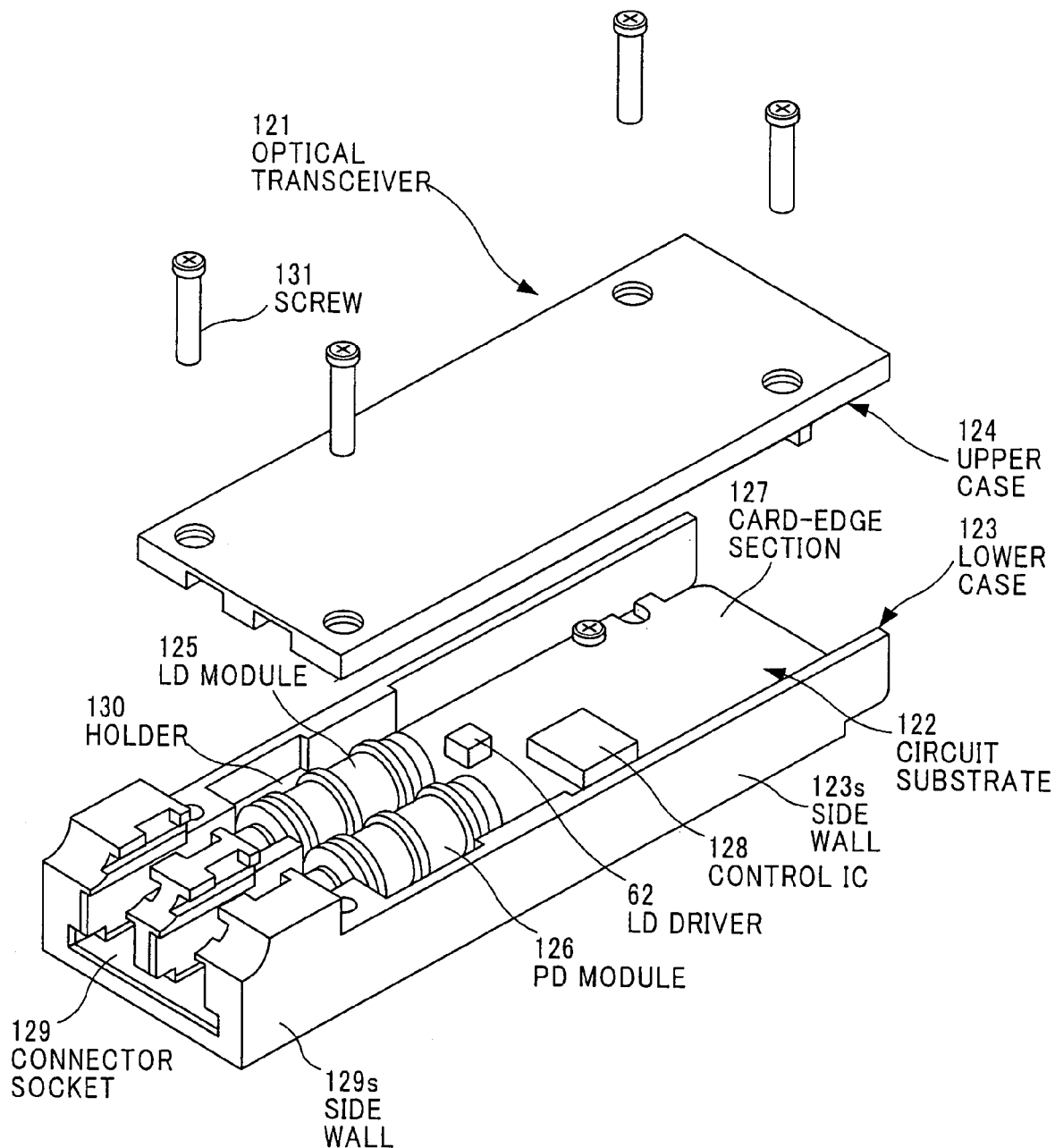
FIG. 12 is an exploded perspective view showing a transceiver as a second preferred embodiment which uses the photoelectric conversion module in the first preferred embodiment according to the present invention.

FIG. 12 is an exploded perspective view showing an optical transceiver 121. The optical transceiver 121 is mainly composed of a circuit substrate 122, a substantial box-shaped lower case 123 inside which the circuit substrate 122 is fixed where most of the upper side, and the backside of the lower case 123 are open, and a substantial plate-shaped upper case 124 (lid) covering most of the opened upper side of the lower body 123.

The optical transceiver 121, along with another end of the circuit substrate 122, is installed detachably on an aperture of a front panel in a peripheral device and includes a pluggable optical connector (not shown), which is a pluggable type.

The lower case 123 and the upper case 124 are formed of metal with a high efficiency in heat release property, for instance, Zn, Al, or the like, by die-casting all at once. The lower case 123 and the upper case 124 may be formed of metal with a high efficiency in heat release property, such as Zn, Al, or the like by cutting operation.

An LD module 125 and a PD (photo diode) module 126 are respectively connected and fixed to a front end of the circuit substrate 122 with solder. The LD module 125 is formed by installing a color laser to collimate an optical axis, and a ferrule to optically connect the photoelectric conversion module 1 with the optical connector (not shown) in the photoelectric conversion module 1 shown in FIG. 2A. The PD module 126 is constructed mostly the same as the LD module 125.

A card-edge section 127 to be fitted to a card-edge connecter of a peripheral device (not shown) is formed at the other end (a back end) of the circuit substrate 122. A connector terminal to electrically connect the circuit substrate 122 with the peripheral device, which is not illustrated in detail, is formed in the card-edge section 127.

Wiring patterns and terminals are formed on the circuit substrate 122, and also electric components such as a control IC 128 to control signals which the LD module 125 and the PD module 126 transmit/receive, and an LD driver 62 to drive an LD element installed in the LD module 125 are mounted thereon.

At one end of the lower case 123, two connector sockets 129 to plug a detachable optical connector with an optical fiber as a transmission path are formed in parallel. In the lower case 123 at the other end of connector sockets 129, a holder 130 to hold the LD module 125 and the PD module 126 is formed.

A lever (not shown) to detach the optical transceiver 121 together with the other end of the circuit substrate 122 from the peripheral device is rotatably installed on both side walls 129s of the connector sockets 129.

The bottom of the lower case 123 is formed to be shorter at a front end thereof than both side walls 123s. That is, at the other end of the lower case 123 a lower side of the lower case 123 together with an upper side and a back side thereof are opened.

The optical transceiver 121 is assembled by firstly installing the circuit substrate 122 to which the LD module 125 and the PD module 126 are fixed in the lower case 123, secondly covering the lower case 123 with the upper case 124, and finally screwing the upper case 124 on the lower case 123 with four screws 131 for fixing.

Advantages of the first and second preferred embodiments will be explained.

The photoelectric conversion module 1, since the LD element 82 is connected to the lead 86R in the vicinity of the LD element 82 through the terminal resistor 3, can match the impedance of the LD element 82 to the impedances of those components such as an LD driver, a substrate, a coaxial cable, or the like outside the package 83.

In particular, an electronic device used for an optical communication such as the transceiver 121 shown in FIG. 12 emits light at the LD element 82 with high-frequency signals, and even in such case, however, the high-frequency signals are not reflected between the LD element 82 and the LD driver 62, between the LD element 82 and the circuit substrate 122, or between the LD element 82 and the coaxial cable. As a result, the photoelectric conversion module 1 allows the LD element 82 or the LD driver 62 to operate accurately with the high-frequency signals, and thus the high-frequency characteristic is excellent.

Furthermore, since in the photoelectric conversion module 1 the terminal resistor 3 is mounted on the flat section 2 of the lead 86R, a new space to receive the terminal resistor 3 inside the package 83 can be minimized and accordingly the photoelectric conversion module 1 is manufactured to be compact.

When the terminal resistor 3 is mounted on the flat section 2 of the lead 86R, heat is generated from the terminal resistor 3 due to an electric current flowing between the LD element 82 and the lead 86R. The photoelectric conversion module 1 is hardly affected by the heat from the LD element 82 and the LD element 82 is not affected by the heat either because, by mounting the terminal resistor 3 on the lead 86R, the heat generated at the terminal resistor 3 is released out of the package 83 along the lead 86R, not through the stem 83s. Consequently the photoelectric conversion module 1 is excellent in heat release property.

In particular, when a lead diameter φR of the lead 86R is formed to be larger by more than the tolerance or the variations in the manufacture than a diameters φ of the other leads 86a to 86c which are not electrically connected to the LD element 82, the heat generated at the terminal resistor 3 is less likely to be transmitted to the LD element 82, while more likely to be transmitted to the stem 83s, the cap 83c, or the lead 86R protruding downward from the stem 83s, and thus the heat can be efficiently released outside the package 83.

Moreover, the lead 86R is insulated from the stem 83s by being inserted into the insulator 5. Therefore, in the photoelectric conversion module 1 the insulator 5 blocks transmission of the heat generated at the terminal resistor 3 to the LD element 82, which can efficiently release the generated heat out of the package 83.

Besides, the optical transceiver 121 using the photoelectric conversion module 1 is, for the same reasons described above, excellent in the high-frequency characteristic, compact, and excellent in the heat radiation.

An example, wherein the LD element 82 is driven by a single circuit to be described later in FIG. 7, has been explained in FIG. 2A and FIG. 2B. Herein, an implementation example where the LD element 82 is driven by a differential circuit to be described later in FIG. 8 will be shown in FIG. 13A and a wiring example thereof will be shown in FIG. 13B.

Third Preferred Embodiment

Figure 13A:
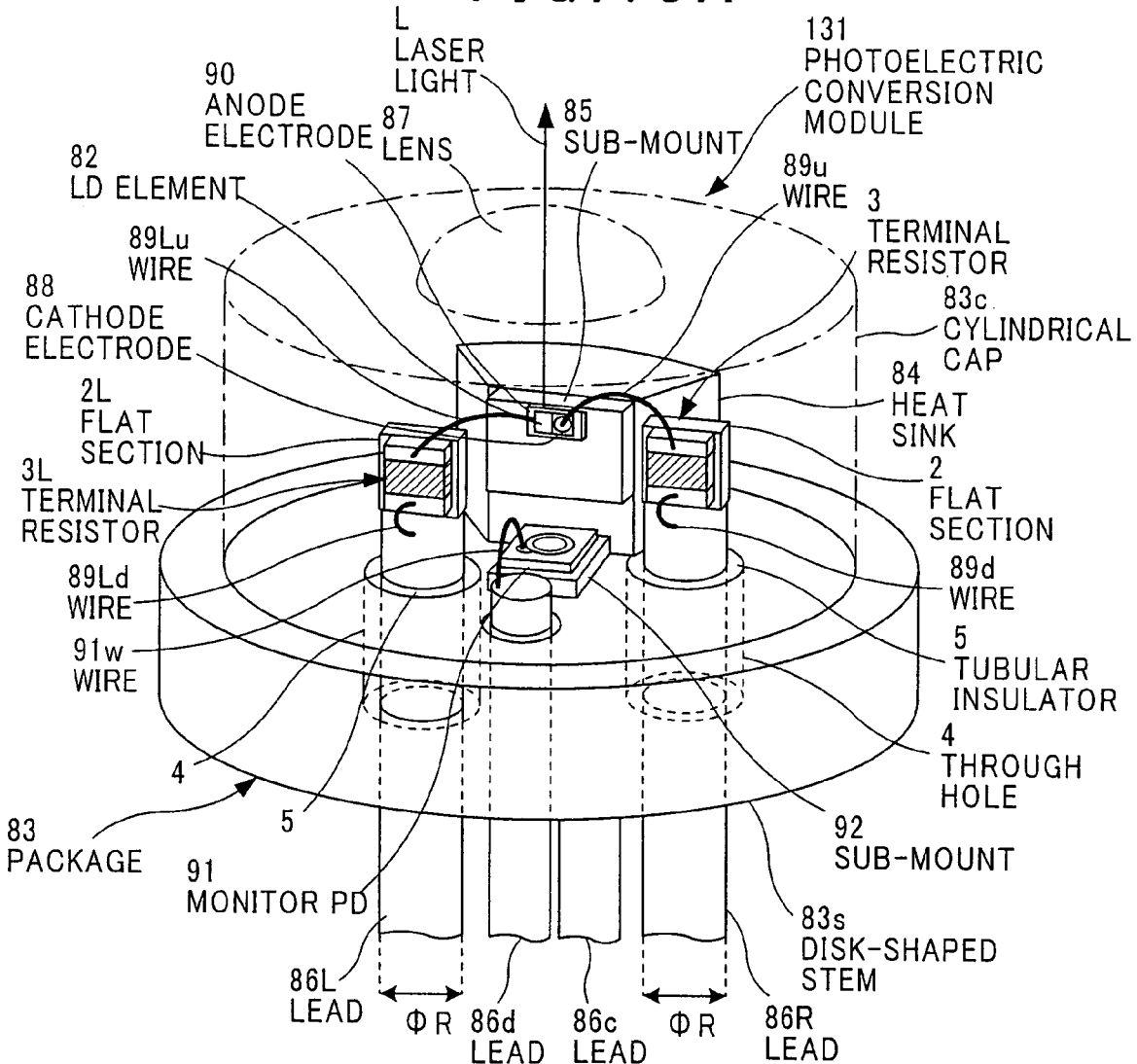
FIG. 13A is a perspective view showing a photoelectric conversion module to be driven by a differential circuit in a third preferred embodiment according to the present invention.
Figure 13B:
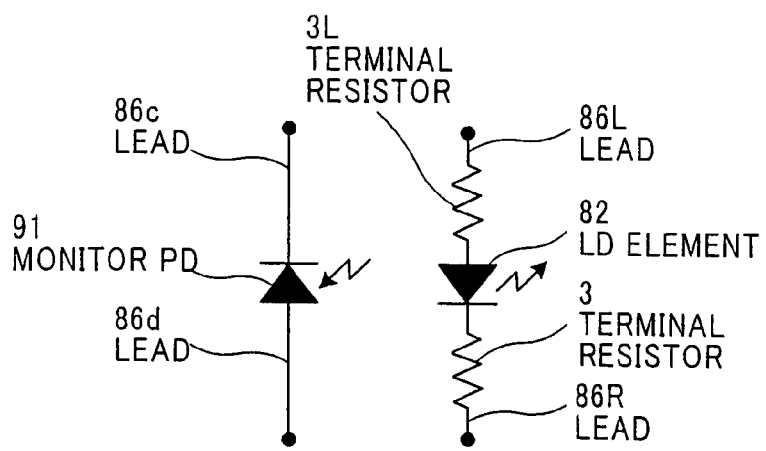
FIG. 13B is a circuit diagram of the photoelectric conversion module of the third embodiment.

FIG. 13A is a perspective view showing a photoelectric conversion module 131 in a third preferred embodiment. FIG. 13B is its circuit diagram. The photoelectric module 131 is an example where a lead 86L is used instead of the lead 86a in FIG. 2A, and a lead 86d is used instead of the lead 86b in FIG. 2A used, and constructed in the same way as the photoelectric conversion module 1 in FIG. 2A, except for the electrical connection of the anode side of the LD element 82 and the electrical connection of the monitor PD 91.

Since the LD element 82 of the photoelectric conversion module 131 is driven by the differential circuit, a flat section 2L is formed at one end of the lead 86L having the same construction as that of the lead 86R and a terminal resistor 3L having the same construction as that of the terminal resistor 3 is mounted on the flat section 2L. Further, by wire-bonding an anode electrode 90 to an electrode at an upper end of the terminal resistor 3L with a wire 89Lu, and an electrode of a lower end of the terminal resistor 3L to the lead 86L with a wire 89Ld respectively, the anode electrode 90 and the lead 86L are electrically connected with each other at the shortest length.

The lead 86d, as well as the lead 86a in FIG. 2A, is nonconductive to, and insulated from the stem 83s by a throughhole and an insulator, which keeps the inside of the package 83 air-tight. The monitor PD 91 is mounted on the stem 83s directly under and adjacent to the LD element 82 through a conductive sub-mount 92. An anode of the monitor PD 91, by being wire-bonded to an end of the lead 86d with the wire 91w, can be electrically connected to the lead 86d at the shortest length.

Namely the lead 86L is used as the anode of the LD element 82, the lead 86d is used as the cathode of the monitor PD 91, the lead 86c is used as the anode of the monitor PD 91, and the lead 86R is used as the cathode of the LD element 82.

It is noted that the electrical connections of the monitor PD 91 may be reversed to those shown in FIG. 13A and FIG. 13B. In this case, an insulating material is disposed between the stem 83s and the sub-mount 92, the cathode of the monitor PD 91 and the end of the lead 86d connect with each other, and the anode of the monitor PD 91 and the upper surface of the stem 83s connect with each other with a wire.

The photoelectric conversion module 131 of the third preferred embodiment brings the same advantages as those of the photoelectric conversion module 1 in FIGS. 2A and 2B.

Next various examples of the electric circuit components will be explained with reference to FIG. 3 to 6.

Figure 3:
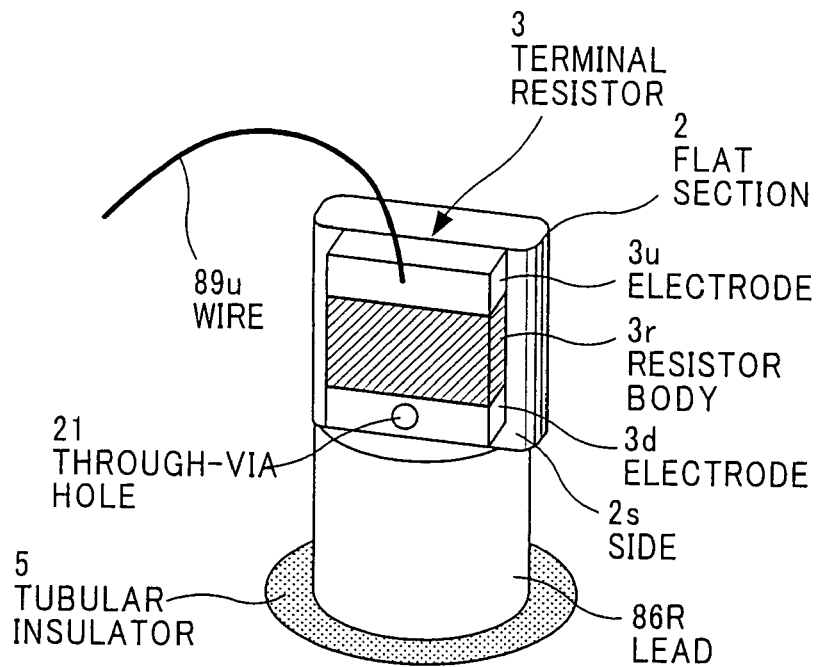
FIG. 3 is a perspective view showing a first example of an electric circuit component of the photoelectric conversion module.

FIG. 3 shows a first example of an electric circuit component. A through-via hole 21 passing through the electrode 3d in the thickness direction and electrically connecting the electrode 3d and the flat section 2 together may be formed in the electrode 3d of the terminal resistor 3. The through-via hole 21 is a column-shaped via hole coated at an inner wall thereof with Au or Cu.

By forming the through-via hole 21, once a wire-bonding is performed, the LD element 82 (refer to FIG. 2A) and the lead 86R are electrically connected, which makes the wire 89d in FIG. 2A unnecessary. Consequently, as compared to a case where the through-via hole 21 is not formed, the length of the wiring between the LD element 82 and the lead 86R becomes shorter, and thus the high-frequency characteristic becomes better.

Figure 4:
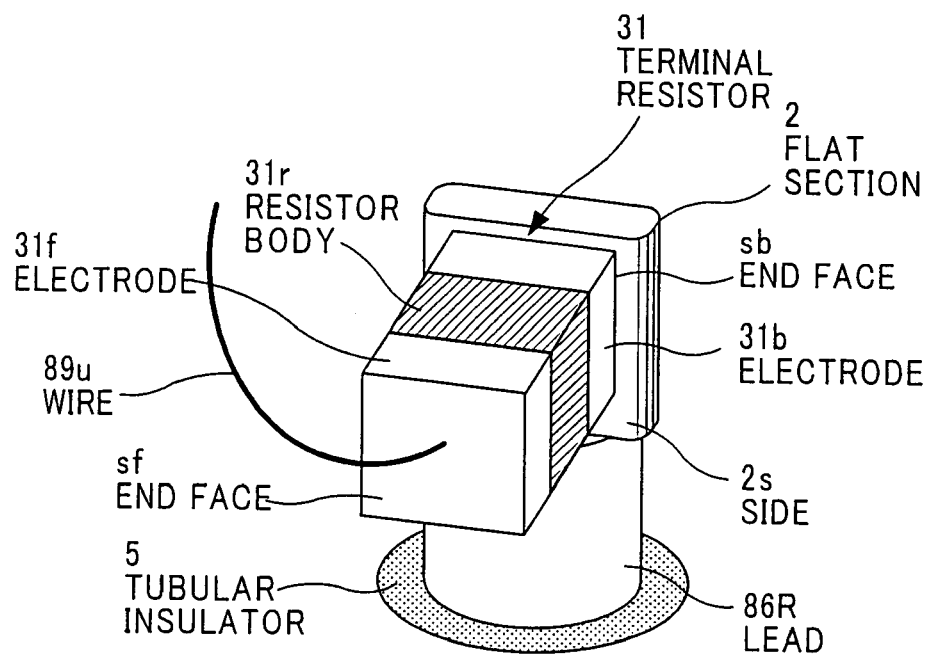
FIG. 4 is a perspective view showing a second example of an electric circuit component of the photoelectric conversion module.

FIG. 4 shows a second example of an electric circuit component. A terminal resistor 31 may be used instead of the terminal resistor 3 in FIG. 2A. The terminal resistor 31 is a thick-film resistor shaped like a cuboid where at both sides of a cuboid-shaped resistor body 31r which forms a thick film resistor body on a surface of a ceramic material, electrodes 31f and 31b made of metal of Au or Cu are formed.

The terminal 31 is located so that the thickness direction thereof is to be perpendicular to the side 85s of the sub-mount 85, which is amounting face of the LD element 82. In the example, since the end-face light emitting-type of the LD element 82 is used, the terminal resistor 31 is mounted by fixing an end face sb of an electrode 31b to the one side 2s of the flat section 2 of the lead 86R with, for instance, conductive adhesives or solder so that these electrodes 31f and 31b disposed at both ends are situated in the front end and the back end.

The LD element 82 (refer to FIG. 2A), by wire-bonding the cathode electrode 88 (refer to FIG. 3A) to an end face sf of the electrode 31f of the terminal resistor 31 with a wire 89u, is electrically connected to the lead 86R through the terminal resistor 31.

When the terminal resistor 31 is used, the high-frequency characteristic becomes better since the wiring length between the LD element 82 and the lead 86R becomes shorter as compared to a case where the terminal resistor 3 is used. Furthermore, in general, since a thick-film resistor is cheaper than a thin-film resistor, the cost is reduced as a whole.

In the above examples of the electric circuit component, the terminal resistor 3 or 31 is used, but an inductor or a capacitor may be used as the electric circuit component.

Figure 5:
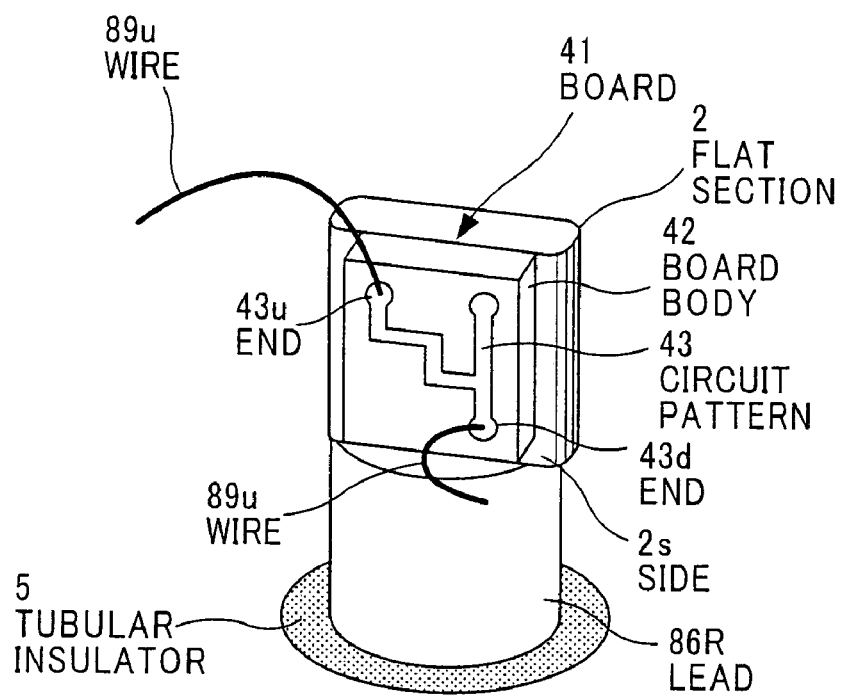
FIG. 5 is a perspective view showing a third example of an electric circuit component of the photoelectric conversion module.

FIG. 5 shows a third example of an electric circuit component. As an electric component to be connected to the LD element 82 (refer to FIG. 2A), a plate-like board 41 (an electric circuit board) installed on the side 2s of the flat section 2 may include at least one of a resistor, an inductor, and a capacitor.

In order to install the board 41 to the flat section 2, for instance, a backside of the board 41 gets gilded, and thereafter, the backside of the board 41 is fixed to the flat section 2 with solder.

The electric circuit board 41 is formed of a board body 42 and an integrated circuit pattern 43 including at least one of a resistor, an inductor, or a capacitor formed on a surface of the board body 42.

The LD element 82 (refer to FIG. 2A), by wire-bonding the cathode electrode 88 (refer to FIG. 2A) to one end 43u of the circuit pattern 43 of the board 41 with a wire 89u and wire-bonding the other end 43d of the circuit pattern 43 of the board 41 to the lead 86R with a wire 89d, is electrically connected to the lead 86R through the board 41.

Figure 6:
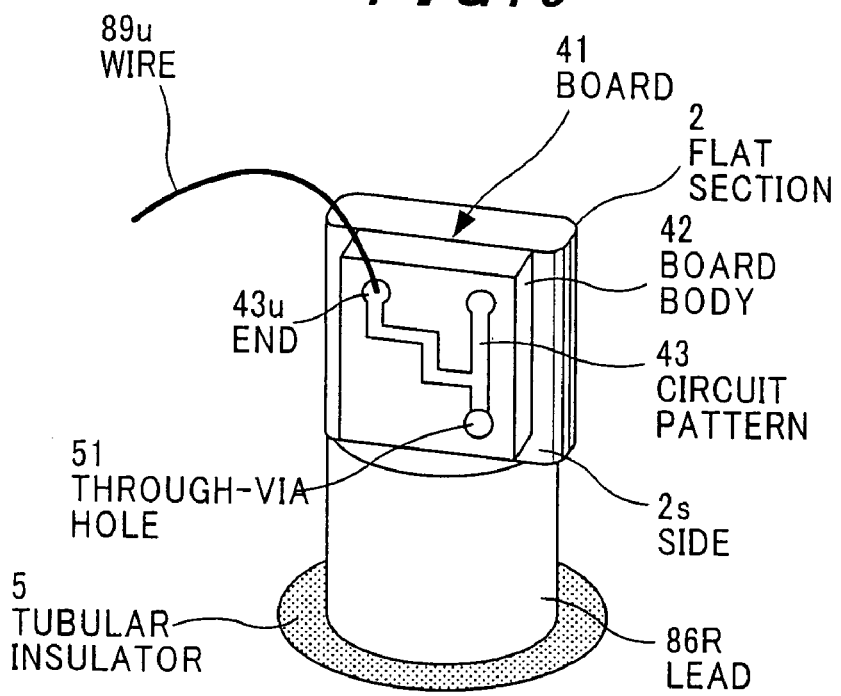
FIG. 6 is a perspective view showing a fourth example of an electric circuit component of the photoelectric conversion module.

FIG. 6 shows a fourth example of an electric circuit component. A through-via hole 51 passing through the other end 43d of the circuit pattern 43 in the thickness direction and electrically connecting the other end 43d of the circuit pattern 43 to the flat section 2 is formed at the other end 43d of the circuit pattern 43. When the through-via hole 51 is formed, since the wire length between the LD element 82 (refer to FIG. 2A) and the lead 86R becomes shorter as compared to a case where the through-via hole 51 is not formed, the high-frequency characteristic becomes better.

Herein an example of the circuit pattern 43 will be described. Firstly, an example where the LD element 82 is driven by a single circuit will be explained.

FIG. 7 shows a first example of a peripheral circuit of a photoelectric conversion module. In a photoelectric conversion module 61, when it is built in an electronic device such as the optical transceiver 121 in FIG. 12, the package 83 is grounded, an LD driver (a pulse generator) 62 to drive the LD element 82 with high-frequency signals is connected to the cathode of the LD element 82, and a DC bias power source (+) 63 as a positive power source to apply a bias power is connected to the anode of the LD element 82.

The LD driver 62 is connected to the cathode of the LD element (for example, its impedance is approximately 7 Ω) 82 through a capacitor C cutting a DC component, a coaxial cable (for example, its impedance is 50 Ω) 64a transmitting high-frequency signals from the LD driver 62 to the LD element 82, and a terminal resistor (for example, its impedance is 43 Ω) Ra inside the package 83. The terminal resistor Ra is the same one as the terminal resistor 3 (or 31) described in FIG. 2A to FIG. 4.

Moreover, the cathode of the LD element 82 is grounded through an inductor La inside the package 83 cutting an AC component. The inductor La is connected in parallel with the terminal resistor Ra. The capacitor Ca as a noise filter is connected in parallel to the inductor La between the inductor La and the package 83. The capacitor Ca has functions of grounding both AC noises from the power source or the high-frequency signals, which have not been blocked by the inductor La completely.

A capacitor Cb as a path of the high-frequency signal components is connected to the DC bias power source 63 in parallel between the DC bias power source 63 and the anode of the LD element 82.

The module 61 is formed of the components excluding the LD driver 62, the DC bias power source 63, the capacitor C, and the coaxial cable 64a from the single circuit.

In the single circuit as stated above, the DC components flow, starting from the DC bias power source 63 and passing through the LD element 82 and the inductor La to the ground in order (in FIG. 7, an arrow D6 shown in one dashed line). Meanwhile, the AC components flow, starting from the condense Cb and passing through the LD element 82, the terminal resistor Ra, the coaxial cable 64a, and capacitor Ca to the LD driver 62 in order (in FIG. 7, an arrow A6 shown in one dashed line).

The circuit pattern 43 in FIG. 5 and FIG. 6 includes, for instance, the terminal resistor Ra, the inductor La, and the capacitor Ca stated above. In the module 61, since the circuit pattern 43 includes the terminal resistor Ra, the LD element 82 impedance-matches to the coaxial cable 64a, and accordingly the LD element 82 is accurately driven by high-frequency signals from the LD driver 62. As a result, the high-frequency characteristic of the module 61 is excellent.

However, in an earlier technology, the inductor La has been connected in parallel between the capacitor C and the coaxial cable 64a. In this case, since the bias electric current flows to a terminal resistor Ra, there is a problem with heat generated at the terminal resistor Ra.

On the other hand, in the module 61, since the circuit pattern 43 includes the inductor La, the bias electric current flows through the inductor La, not through the terminal resistor Ra, and thus, even if the circuit pattern 43 includes terminal resistor Ra, generation of heat at the terminal resistor Ra can be prevented. In addition, high-frequency signals from the LD driver 62 flows nowhere except for the LD element 82.

Figure 8:
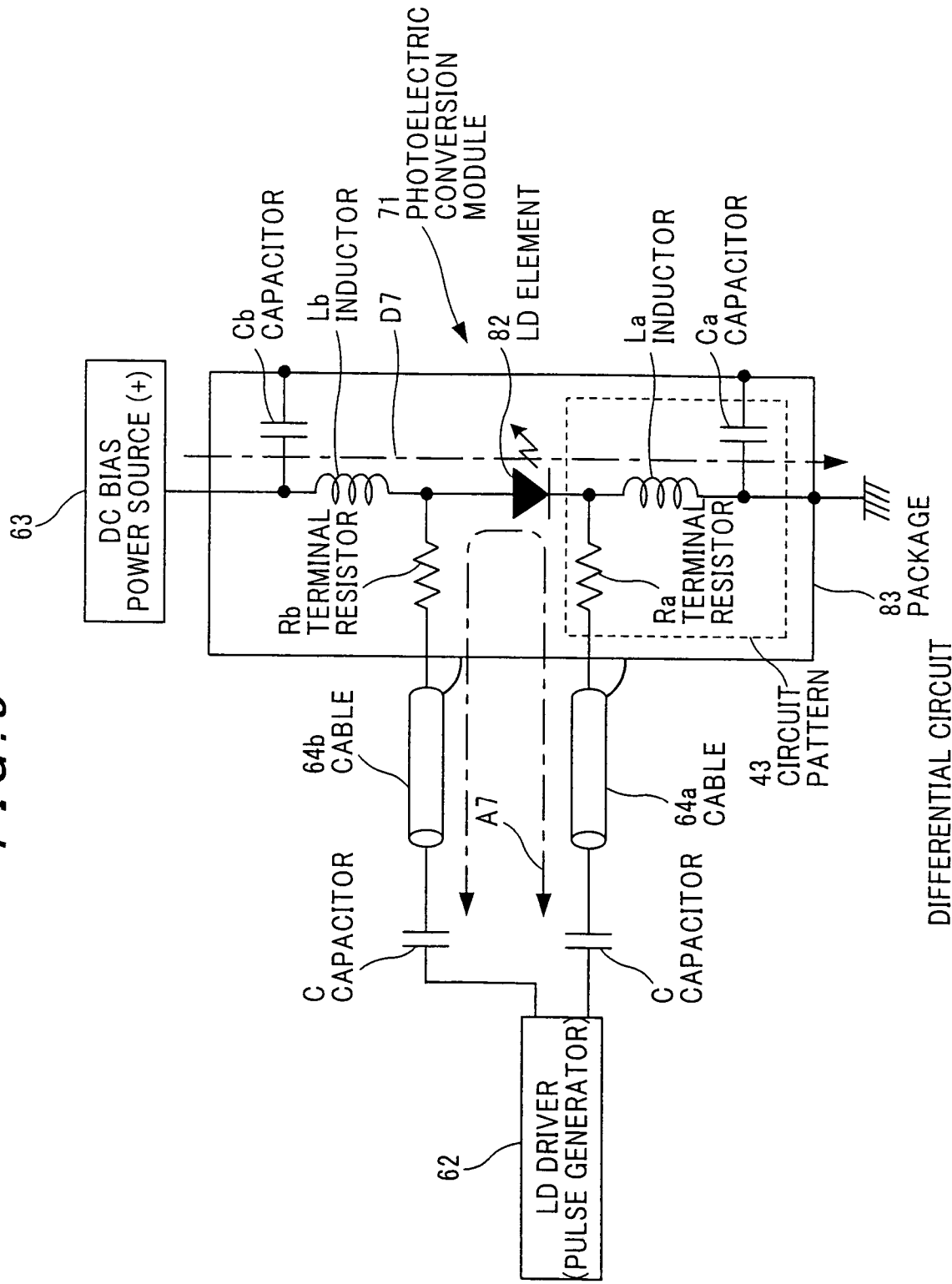
FIG. 8 is a circuit diagram showing a second example of a peripheral circuit of the photoelectric conversion module in the first preferred embodiment according to the present invention.

FIG. 8 shows a second example of a peripheral circuit of a photoelectric conversion module. The peripheral circuit is a differential circuit with an LD driver 62 to differential-amplify an LD element 82.

As shown in FIG. 8, in a photoelectric conversion module 71, in addition to the components of the single circuit in FIG. 7, a capacitor C, a coaxial cable 64b, and a terminal resistor Rb are inserted between the LD driver 62 and an anode of the LD element 82, and further, an inductor Lb is connected in parallel between a terminal resistor Rb and a capacitor Cb. An inductor Lb has the same function as the inductor La. Besides, in the differential circuit, the capacitor Cb is not the path-capacitor, but has the same function as the capacitor Ca. These terminal resistors Ra and Rb are respectively the same one as the terminal resistor 3 (or 31) described in FIG. 2A to FIG. 4 and the terminal resistor 3L described in FIG. 13A.

In the differential circuit as constructed above, the DC components flow, starting from the DC bias power source 63 and passing through the inductor Lb, the LD element 82 and the inductor La to the ground in order (in FIG. 8, an arrow D7 shown in one dashed line). Meanwhile, the AC components flow, starting from the capacitor C and passing through the coaxial cable 64a, the terminal resistor Ra, the LD element 82, the terminal resistor Rb, and the coaxial cable 64b, to the capacitor C in order or in a reverse flow (in FIG. 8, an arrow A7 shown in one dashed line).

When the module 71 using the differential circuit is compared with the module 61 with the single circuit in FIG. 7, the module 71 has the advantage of reducing deterioration of the signals. Other advantages are the same as those of the module 61.

A circuit pattern, for instance, in addition to the components of the circuit pattern 43, may include a terminal resistor Rb, an inductor Lb, and a capacitor Cb. In FIG. 7 and FIG. 8, it is explained that a positive power source as a DC bias power source 63 is used, but instead of the positive power source, a negative power source as a DC bias power source may be used. In this case, the negative power source is connected to the cathode of the LD element 82.

Figure 9A:
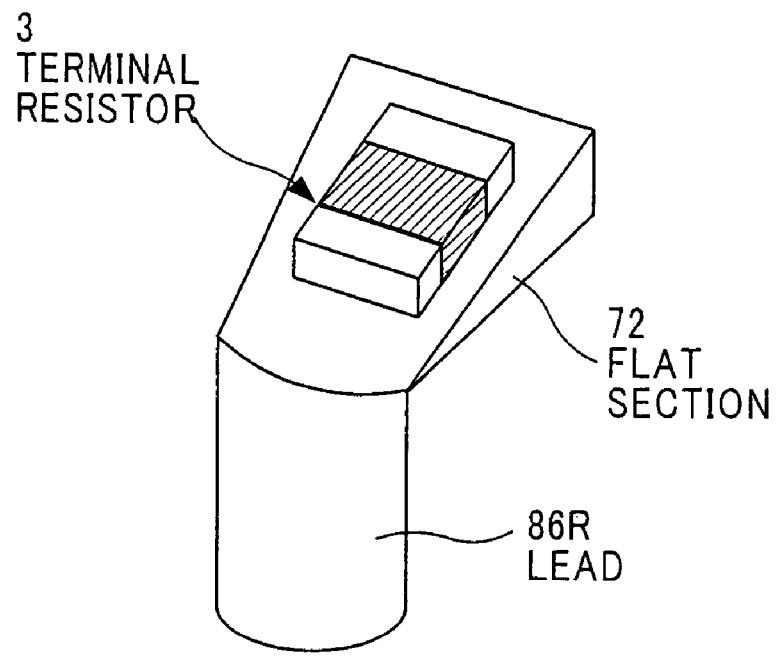
FIG. 9A is a perspective view showing an example of a lead.
Figure 9B:
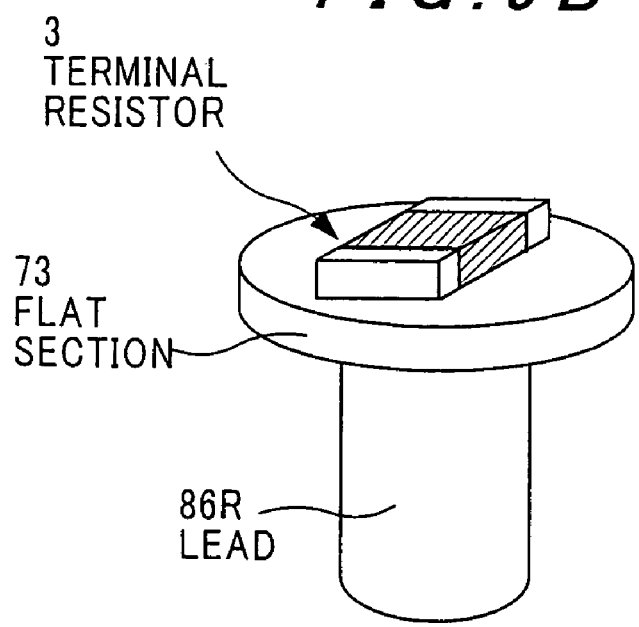
FIG. 9B is a perspective view showing another example of a lead.

The flat section 2 of the lead 86R described in FIG. 2A to FIG. 6 is in parallel with both the side 84s of the heat sink 84, and the front and back surfaces of the sub-mount 85, and however, as a flat section, a substantial plate-like flat section 72 may be disposed oblique to an axial direction of lead 86R at the end of the lead 86R shown FIG. 9A or a disc shaped flat section 73 may be disposed perpendicular to the axial direction of the lead 86R at the end thereof shown FIG. 9B.

In the preferred embodiments as stated above, it is explained that an end-face light-emitting-type of the LD element 82 is used as an optical element, but a VICSEL-type of an LD element may be used as an optical element. In this case, for instance, the lead 86R forming the flat section 72 in FIG. 9B may be used.

Besides, in the preferred embodiments as stated above, the LD element 82 is used as an optical element, but as an optical element, a light emitting diode (LED) or a photo diode may be used.

Example According to the Present Invention

The photoelectric conversion module 1 housing the terminal resistor 3 therein having an impedance value of 24 Ω shown in FIG. 2A and FIG. 2B is produced.

An Example of the Related Art

The photoelectric conversion module 81 without a built-in resistor is produced.

Figure 10:
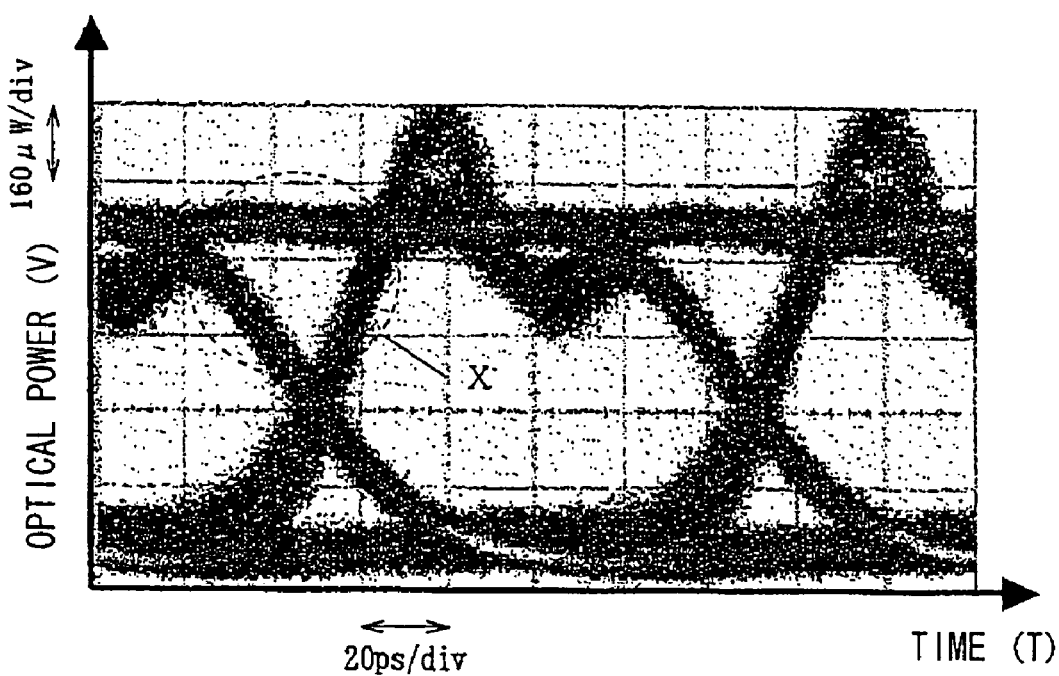
FIG. 10 is a diagram showing an optical waveform of an example according to the first preferred embodiment of the present invention.
Figure 11:
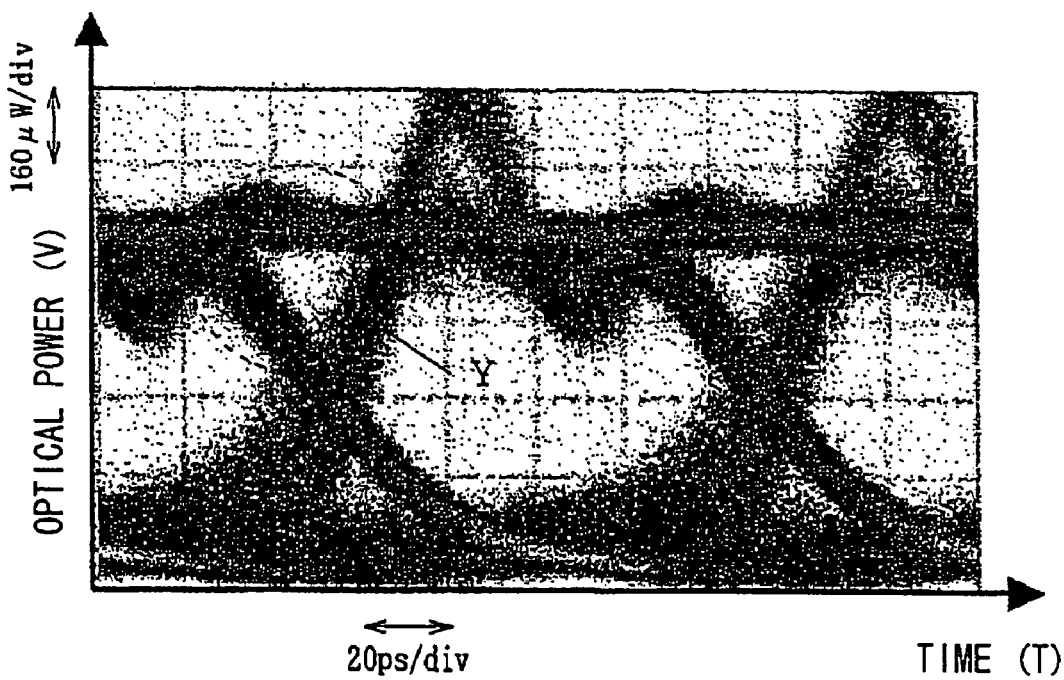
FIG. 11 is a diagram showing an optical waveform of the related art.

FIG. 10 shows an optical waveform produced when a pseudo random signal at a high-frequency of 10 Gb/s is inputted to the LD element 82 in the example according to the present invention through the lead (lead pin)86R. And FIG. 11 shows an optical waveform in the example of the related art. The optical waveform is produced when the same signal as that in the example according to the present invention is inputted to the LD element 82. In FIG. 10 and FIG. 11, the horizontal axis indicates the time t (20 ps/div) and the vertical axis indicates the optical power V (160 μW/div).

FIG. 10 shows that in the example according to the present invention, since high-frequency signal paths (for example, between the LD element 82 and the LD driver, between the LD element 82 and the board, or between the LD element 82 and the coaxial cable) are impedance-matched with each other by the built-in terminal resistor 3, signal reflection at the high-frequency signal paths is suppressed, and further, since heat generated at the terminal resistor 3 is transmitted to the outside of the package 83 through the lead 86R, but not to the LD element 82, distortion of the optical waveform is small, which allows a high-speed optical communication.

For instance, since in the area X circled by a dotted line in FIG. 10, an aperture rate of the eye-pattern (an amount of the open space of the waveform) is large in the example according to the present invention, it is obvious that identification of optical signals becomes accurate and frequency of occurrence of transmission errors is low.

On the contrary, FIG. 11 shows the conventional example doesn't include a resistor therein, and thus the impedance-matching at the paths of high-frequency signals is not performed. Therefore, due to the signal reflection at the paths of the high-frequency signals, the width of the optical waveform is wide and the optical waveform is distorted.

For instance, since in the area Y circled by a dotted line in FIG. 11, an aperture rate of the eye-pattern (an amount of the open space of the waveform) is small in the example according to the related art, it is obvious that identification of optical signals becomes inaccurate and frequency of occurrence of transmission errors is high.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claim is:

1. A photoelectric conversion module, comprising:
a heat sink;
an electric circuit comprising an optical element to transmit an optical signal, the optical element being provided on the heat sink;
a stem to fix the optical element;
a cap to cover the optical element;
a plurality of leads to apply an electric signal to the optical element, said plurality of leads comprising a predetermined lead having an end which comprises a flat section disposed in a package formed of the stem and the cap;
wherein said electric circuit comprises an electric circuit component which includes a terminal resistor for impedance-matching the optical element to a component outside the package,
wherein one of said terminal resistor and a circuit pattern including said terminal resistor is formed on said flat section and includes an end which is connected by a wire to the optical element and another end which is connected to the predetermined lead,
wherein the package is filled with an inert gas, and
wherein the optical element and the electric circuit component are separated by a gap.

2. The photoelectric conversion module according to claim 1, wherein the terminal resistor comprises a thin-film resistor with electrodes formed at both ends of a thin-plate shaped resistor body and is located to direct a thickness direction thereof to be perpendicular to a mounting-face of the optical element.

3. The photoelectric conversion module according to claim 2, wherein the thin-film resistor comprises a through-via hole, which is formed therein to pass through one of the electrodes in a thickness direction thereof and to electrically connect the one of the electrodes to the flat section.

4. The photoelectric conversion module according to claim 1, wherein the terminal resistor comprises a thick-film resistor with electrodes formed at both ends of a cuboid shaped resistor body and is located to direct a thickness direction thereof to be perpendicular to a mounting-face of the optical element.

5. The photoelectric conversion module according to claim 1, wherein the electric circuit component comprises a substrate including a surface on which said circuit pattern including the terminal resistor and at least one of an inductor and a capacitor are formed.

6. The photoelectric conversion module according to claim 5, wherein the substrate comprises a through-via hole, which is formed therein to pass through the circuit pattern in a thickness direction thereof and to electrically connect the circuit pattern to the flat section.

7. The photoelectric conversion module according to claim 1, wherein the predetermined lead comprises a Cu alloy, and
wherein a diameter of the predetermined lead is greater than that of a lead which is other than connected to the electric circuit component at an end of the lead.

8. The photoelectric conversion module according to claim 1, wherein a heat insulator is disposed in a through hole to pass through the package, and wherein the predetermined lead is inserted into the insulator.

9. An optical transceiver, comprising:
a photoelectric conversion module comprising:
a heat sink;
an electric circuit comprising an optical element to transmit an optical signal, the optical element being provided on the heat sink;
a stem to fix the optical element;
a cap to cover the optical element;
a plurality of leads to apply an electric signal to the optical element, said plurality of leads comprising a predetermined lead having an end which comprises; and a flat section disposed in a package formed of the stem and the cap;
wherein said electric circuit comprises an electric circuit component which includes a terminal resistor for impedance-matching the optical element to a component outside the package,
wherein one of said terminal resistor and a circuit pattern including said terminal resistor is formed on said flat section and includes an end which is connected by a wire to the optical element and another end which is connected to the predetermined lead,
wherein the package is filled with an inert gas, and
wherein the optical element and the electric circuit component are separated by a gap.

10. The optical transceiver according to claim 9, wherein the terminal resistor comprises a thin-film resistor with electrodes formed at both ends of a thin-plate shaped resistor body and is located to direct a thickness direction thereof to be perpendicular to a mounting-face of the optical element.

11. The optical transceiver according to claim 10, wherein the thin-film resistor comprises a through-via hole, which is formed therein to pass through one of the electrodes in a thickness direction thereof and to electrically connect the one of the electrodes to the flat section.

12. The optical transceiver according to claim 9, wherein the terminal resistor comprises a thick-film resistor with electrodes formed at both ends of a cuboid shaped resistor body and is located to direct a thickness direction thereof to be perpendicular to a mounting-face of the optical element.

13. The optical transceiver according to claim 9, wherein the electric circuit component comprises a substrate including a surface on which said circuit pattern comprising the terminal resistor and at least one of an inductor and a capacitor are formed.

14. The optical transceiver according to claim 13, wherein the substrate comprises a through-via hole, which is formed therein to pass through the circuit pattern in a thickness direction thereof and to electrically connect the circuit pattern to the flat section.

15. The optical transceiver according to claim 9, wherein the predetermined lead comprises a Cu alloy, and
wherein a diameter of the predetermined lead is greater than that of a lead which is other than connected to the electric circuit component at an end of the lead.

16. The optical transceiver according to claim 9, wherein a heat insulator is disposed in a through hole to pass through the package, and
wherein the predetermined lead is inserted into the insulator.

17. The photoelectric conversion module according to claim 1, wherein the heat sink and the flat section are separately formed.

18. The photoelectric conversion module according to claim 1, further comprising:
another optical element to receive the optical signal.

19. The optical transceiver according to claim 9, wherein the heat sink and the flat section are separately formed.

20. The optical transceiver according to claim 9, further comprising:
another optical element to receive the optical signal.

21. The photoelectric conversion module according to claim 1, wherein said terminal resistor is connected to the optical element by a wire.

22. The photoelectric conversion module according to claim 1, wherein said optical element and said terminal resistor are separated by a gap.

23. The photoelectric conversion module according to claim 1, wherein said component of said electric circuit is bonded to said flat section by one of an adhesive and a solder.

24. The photoelectric conversion module according to claim 1, wherein said predetermined lead has a diameter which is greater than a diameter of another lead in said plurality of leads.

25. The photoelectric conversion module according to claim 1, wherein said optical element comprises a laser diode element, said terminal resistor being connected to an electrode of said laser diode element by a wire.

26. A photoelectric conversion module, comprising:
a heat sink;
a plurality of leads for applying an electric signal to an optical element, a lead in said plurality of leads comprising an end having a flat portion; and
an electric circuit comprising:
an optical element for transmitting an optical signal, the optical element being formed on the heat sink; and
an electric circuit component which is separated from said optical element by a gap and comprises a terminal resistor to impedance-match the optical element to a component outside the package,
wherein one of said terminal resistor and a circuit pattern including said terminal resistor is formed on said flat portion of said lead and includes an end which is connected by a wire to the optical element and another end which is connected to said lead.

27. The optical transceiver according to claim 9, wherein said optical element and said terminal resistor are separated by a gap.

* * * * *